United States Patent
Chung et al.

(10) Patent No.: US 10,153,366 B2
(45) Date of Patent: Dec. 11, 2018

(54) LDMOS TRANSISTOR WITH LIGHTLY-DOPED ANNULAR RESURF PERIPHERY

(71) Applicant: Polar Semiconductor, LLC, Bloomington, MN (US)

(72) Inventors: Thomas S. Chung, Lakeville, MN (US); Noel Hoillien, Minneapolis, MN (US); Peter N. Manos, Eden Prairie, MN (US); Steven Kosier, Lakeville, MN (US)

(73) Assignee: Polar Semiconductor, LLC, Bloomington, MN (US)

( * ) Notice: Subject to any disclaimer, the term of this patent is extended or adjusted under 35 U.S.C. 154(b) by 42 days.

(21) Appl. No.: 15/065,204

(22) Filed: Mar. 9, 2016

(65) Prior Publication Data
US 2017/0263759 A1    Sep. 14, 2017

(51) Int. Cl.
*H01L 29/00* (2006.01)
*H01L 21/00* (2006.01)
(Continued)

(52) U.S. Cl.
CPC ........ *H01L 29/7816* (2013.01); *H01L 23/535* (2013.01); *H01L 29/0634* (2013.01); *H01L 29/0865* (2013.01); *H01L 29/0882* (2013.01); *H01L 29/1095* (2013.01); *H01L 29/41758* (2013.01); *H01L 29/66681* (2013.01)

(58) Field of Classification Search
CPC ............ H01L 29/7816; H01L 29/0634; H01L 29/0865; H01L 29/0882; H01L 29/1095; H01L 29/41758; H01L 29/66681; H01L 23/535
See application file for complete search history.

(56) References Cited

U.S. PATENT DOCUMENTS 5,286,995 A   2/1994   Malhi
5,852,314 A   12/1998  Depetro et al.
(Continued)

OTHER PUBLICATIONS

Vijay Parthasarathy et al., "SOA Improvement by a Double RESURF LDMOS Technique in Power IC Technology", IEEE, 2000.
(Continued)

*Primary Examiner* — Dale E Page
*Assistant Examiner* — Quovaunda V Jefferson
(74) *Attorney, Agent, or Firm* — Kinney & Lange, P.A.

(57) ABSTRACT

Apparatus and associated methods relate to controlling an electric field profile within a drift region of an LDMOS device using first and second RESURF regions. The first RESURF region extends from a source end toward a drain end of the LDMOS device. The first RESURF region is adjacent to a forms a metallurgical junction with the drift region. The second RESURF layer extends from the drain end toward the source end of the LDMOS device. The second RESURF layer has an end that is longitudinally between the body contact and the source end of the first RESURF layer. A distance between the end of the second RESURF layer and the body contact is greater than a vertical distance between the end of the second RESURF layer and the body contact. A maximum electric field between the second RESURF layer and the body contact can be advantageously reduced with this geometry.

18 Claims, 9 Drawing Sheets

(51) Int. Cl.
*H01L 29/78* (2006.01)
*H01L 29/06* (2006.01)
*H01L 29/08* (2006.01)
*H01L 29/10* (2006.01)
*H01L 29/417* (2006.01)
*H01L 29/66* (2006.01)
*H01L 23/535* (2006.01)

(56) References Cited

U.S. PATENT DOCUMENTS

| | | | | |
|---|---|---|---|---|
| 2011/0127583 | A1* | 6/2011 | Uhlig | G01R 33/07 |
| | | | | 257/252 |
| 2012/0211832 | A1* | 8/2012 | Chu | H01L 29/402 |
| | | | | 257/335 |
| 2015/0179793 | A1* | 6/2015 | Denison | H01L 29/7823 |
| | | | | 257/337 |
| 2015/0243781 | A1 | 8/2015 | Min et al. | |

OTHER PUBLICATIONS

Li Xiaogang et al., "A Charge Allocating Model for the Breakdown Voltage Calculation and Optimization of Lateral RESURF Devices", Journal of Semiconductors, vol. 30, No. 3, Mar. 2009.

Zhang Jun et al., "One-dimensional breakdown voltage model of SOI RESURF lateral power device based on lateral linearly graded approximation", Chin, Phys. B, vol. 24, No. 2, 2015.

Sunitha HD, Keshaveni N, "Reduced Surface Field Technology for LDMOS: A Review", International Journal of Emerging Technology and Advanced Engineering Certified Journal, vol. 4, Issue 6, Jun. 2014.

Jin He et al., "Linearly graded doping drift region: a novel lateral voltage-sustaning layer used for improvement of RESURF LDMOS transistor performances", Semiconductor Science and Technology 17 (2002) 721-728.

G. Charitat et al., "High voltage RESURF LDMOS for smart power integrated circuits", Revue de Physique Appliquee, 1989, 24 (10), pp. 993-1000.

\* cited by examiner

LDMOS TRANSISTOR WITH LIGHTLY-DOPED ANNULAR RESURF PERIPHERY

BACKGROUND

High voltage MOSFETs are a type of Metal Oxide Semiconductor Field Effect Transistor (MOSFET) that is designed to operate with high voltage differentials presented across terminals of the transistor. High voltage differentials necessarily results in a formation of electric fields within the device. High voltage differentials can be tolerated when the attendant electric fields nowhere exceed a critical threshold that causes avalanche breakdown. Electric fields can be decreased by distributing the field-generating high voltage differentials over large spatial dimensions of the semiconductor device.

Low conductivity regions of a semiconductor device, if arranged in a proper manner, can be used to distribute high voltage differentials. Such low conductivity semiconductor regions can include regions that are substantially depleted of majority carriers, regions that are lightly doped, and regions that are undoped. Such high voltage differentials should be distributed both laterally and vertically to ensure that attendant electric fields do not exceed the critical threshold that causes avalanche breakdown.

Therefore, high voltage MOSFETS can be manufactured using thick epitaxial layers that are lightly doped. But such thick lightly-doped epitaxial layers are not compatible with low voltage high-density CMOS devices. Low voltage high-density CMOS devices typically are manufactured on wafers that have relatively thin epitaxial layers that are more heavily doped than can be tolerated by high voltage devices. Various circuit applications require both dense logic, which can be manufactured using low voltage high-density CMOS devices, and high voltage transistors, which require generous spatial distributions of high voltage differentials.

SUMMARY

An electronic device includes a Laterally-Diffused Metal-Oxide-Semiconductor (LDMOS) transistor formed in a semiconductor die having an interconnect region on an active region. The interconnect region includes a gate of the LDMOS transistor. The gate is isolated from the active region via a dielectric. The active region includes a source of the LDMOS transistor longitudinally aligned to an end of the gate. The active region includes a drain of the LDMOS transistor. The drain includes a drain contact region and a drift region vertically isolated from the gate via the dielectric. The active region includes a body of the LDMOS transistor. The body includes a body contact region and a channel region juxtaposed longitudinally between the source and the drift region. The channel region is vertically isolated from the gate via the dielectric. The active region includes a lower RESURF (e.g., a region designed to REduce a SURface Field so as to increase a breakdown voltage) region substantially parallel to and vertically separated from the drift region. The active region also includes an upper RESURF region adjacent to and vertically interdigitated between both the drift region above and the lower RESURF region below. The lower RESURF region longitudinally extends from the drain contact region toward the source. A first longitudinal distance between the drain contact region and the body contact region is greater than a second longitudinal distance between the drain contact region and an end of the lower RESURF region.

DETAILED DESCRIPTION

Controlling a free-carrier population in a drift region of an LDMOS transistor affects various performance metrics of the device. If a large population of free carriers exists in the drift region, a low on-resistance may be obtainable. Conversely, if the population of free carriers is substantially depleted from the drift region, a high voltage on the drain terminal can be tolerated without the device experiencing a breakdown condition. High voltages can be tolerated without experiencing a breakdown condition if the field associated with the high voltage is everywhere controlled to less than a threshold. If the field exceeds the threshold, avalanche breakdown might result.

An electric field is proportional to a spatial derivative of a corresponding voltage. Therefore, to reduce a maximum field associated with a high voltage, a differential between the high voltage and other low voltage terminals must be distributed over spatial dimensions so that the spatial derivative of the voltage is everywhere maintained below a critical threshold.

Figure 1:
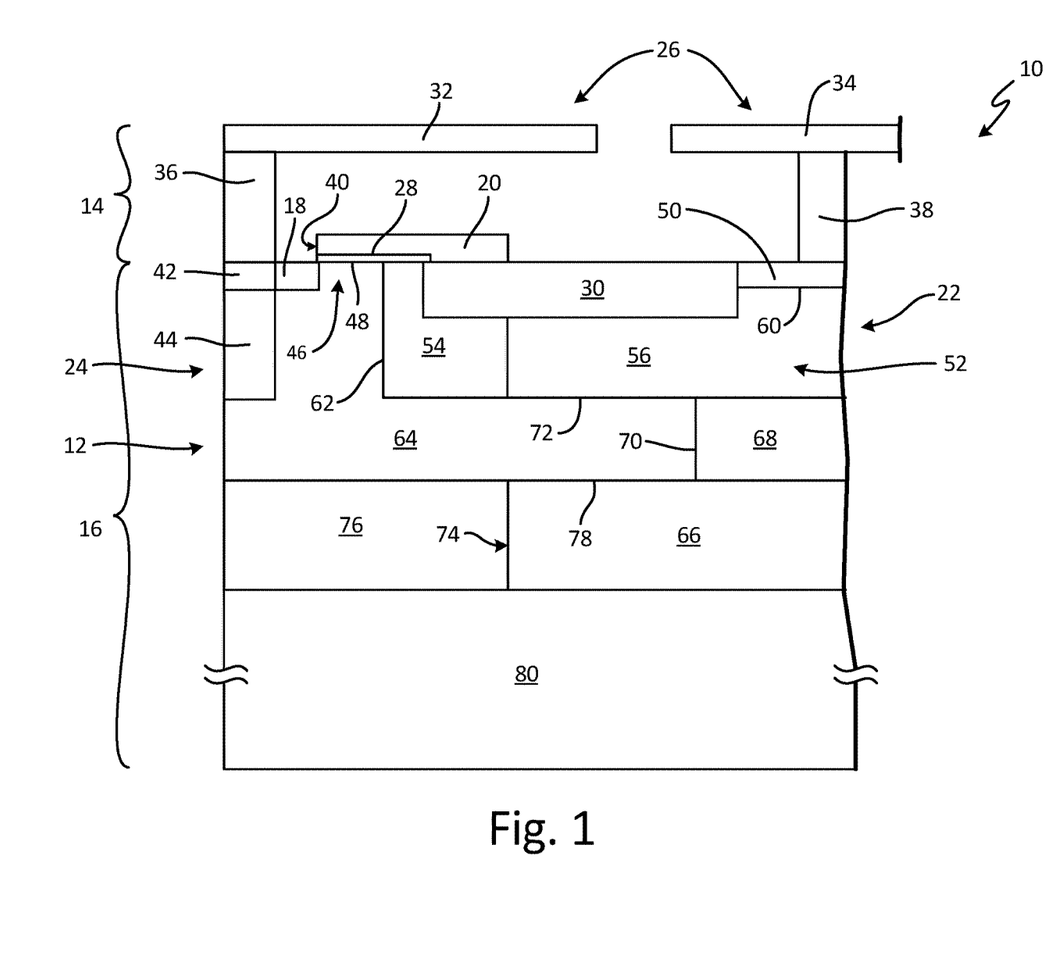
FIG. 1 is a cross-sectional view of an exemplary LDMOS transistor with lightly-doped annular RESURF periphery.

FIG. 1 is a cross-sectional view of an exemplary LDMOS transistor with lightly-doped annular RESURF periphery. In FIG. 1, LDMOS transistor 10 is formed in semiconductor die 12 having interconnect region 14 upon active region 16. LDMOS transistor 10 has source 18, gate 20, drain 22, and body 24, each formed by various material layers formed in specific configurations. Although such LDMOS transistors 10 as depicted in FIG. 1 can be called a "lateral transistor," herein the direction of electrical current conduction (i.e., from drain 22 on the right side of FIG. 1 toward source 18 on the left side of FIG. 1) will be called the longitudinal direction. And the direction parallel to the surface of the semiconductor and perpendicular to both the longitudinal direction and the vertical direction will be called the lateral direction (i.e., the direction into the paper).

Interconnect region 14 includes various conductive layers separated from one another by various dielectric layers. Contacts and/or vias connect the various conductive layers to one another and/or to underlying active region 16. In the depicted embodiment, interconnect region 14 includes polysilicon gate 20 and first metal layer 26. Polysilicon gate 20 is conductively isolated from active region 16 via gate dielectric 28 and field dielectric 30. First metal layer 26 is patterned into source interconnect net 32 and drain interconnect net 34. Source interconnect net 32 is conductively connected to source 18 via contact 36. Drain interconnect net 34 is conductively connected to drain 22 via contact 38.

In the depicted embodiment, source 18, drain 22, and body 24 are formed in active region 14. Polysilicon gate 20 has end 40 that can be used to align both source 18 and body 24 to end 40. For example, a dopant species that will ultimately form source 18 can implanted into active region 14 using end 40 of polysilicon gate 20 to mask such an implant. Similarly, a dopant species that will ultimately form body 24 can be implanted into active region 14 using end 40 of polysilicon gate 20 to mask such an implant. Both implanted dopant species (those that will ultimately form both the source and the body), can then diffuse both vertically into active area 14 and laterally beneath end 40 of polysilicon gate 20. These implanted dopant species can diffuse a greater distance or a smaller distance depending upon thermal cycles to which semiconductor die 12 is subject subsequent to the dopant implantations. Because end 40 of polysilicon gate 20 masks the implantation of these dopant species, the lateral extent that each of source 18 and body 24 diffuse underneath polysilicon 20 is aligned with end 40 of polysilicon gate 20.

In the depicted embodiment, body 24 has body contact region 42, body sinker region 44, and active body region 46. Body contact region 42 can be a relatively heavily doped region to which conductive connection to interconnect net 32 is made via contact 36. In some embodiments, both source 18 and body 24 can be commonly biased. In the depicted embodiment, body 24 shares contact 36 and interconnect net 32 with source 18, and therefore body 24 is commonly biased with source 18. Body sinker region 44 can be a relatively heavily doped region used to suppress a beta current gain of a parasitic bipolar transistor. Source 18 of LDMOS transistor 10 acts as emitter of such a parasitic bipolar transistor. Body 24 of LDMOS transistor 10 acts as base of this parasitic bipolar transistor. And an underlying region having the same net dopant type as source 18 of LDMOS transistor 10 acts as collector of this parasitic bipolar transistor. Active body region 46 is below and proximate gate dielectric 28. A conduction channel can be formed at interface 48 between active-body-region 46 and gate-dielectric 28 when induced by a field generated by a voltage difference between polysilicon gate 20 and body 24.

Drain 22 has drain contact region 50 and drift region 52. In the depicted embodiment drift region 52 includes a first drift region 54 and a second drift region 56. First drift region 54 is at a source end of drift region 52, and second drift region 56 is at a drain end of drift region 52. In some embodiments, first drift region 54 and second drift region 56 can have different net dopant concentrations from each other. For example, first drift region 54 can have a net dopant concentration that is less than a net dopant concentration of second drift region 56. In some embodiments, it may be advantageous for the relative net dopant concentrations to be reversed (i.e., a net dopant concentration of first drift region 54 can be greater than a net dopant concentration of second drift region 56).

Drain contact region 50 can be a relatively heavily doped region to which conductive connection to drain interconnect net 34 is made via contact 38. Drift region 52 longitudinally extends from drain contact region 50 to body 24. Drift region 52 is conductively connected to drain contact region 50 at drain-contact-region/drift-region interface 60. Drift region 52 is otherwise isolated from interconnect region 14 via gate dielectric 28 and field dielectric 30. Drift region 52 longitudinally abuts and forms a metallurgical junction with body 24 at drift-region/body metallurgical junction 62.

LDMOS transistor 10 includes first REduced SURFace Field (RESURF) region 64 and second RESURF region 66. First RESURF region 64 is conductively connected to body 24. Second RESURF region 66 is conductively connected to drift region 52 via vertical conduction region 68. In some embodiments, vertical conduction region 68 can have a net dopant concentration that is less than a net dopant concentration of one or both of second drift region 56 and second RESURF region 66. For example, the net dopant concentration of vertical conductive region 68 can be established during an epitaxial growth step. First RESURF region 64 longitudinally extends from body 24 to vertical conduction region 68. First RESURF region 64 longitudinally abuts and forms a metallurgical junction with vertical conduction region 68 at first-RESURF-region/vertical-conductive-region metallurgical junction 70. First RESURF region 64 also forms a metallurgical junction with drift region 52 at first-RESURF-region/drift-region metallurgical junction 72.

Second RESURF region 66 longitudinally extends from vertical conduction region 68 to end 74 of second RESURF region 66. In the depicted embodiment, annular extension region 76 is a region of the same net dopant type as second RESURF region 66. Annular extension region has a net dopant concentration that is less than the net dopant concentration of second RESURF region 66. Annular extension region extends from end 74 of second RESURF region 66 and underneath source 18 of LDMOS transistor 10. Second RESURF region 66 forms a metallurgical junction with first RESURF region 64 at second-RESURF-region/first-RESURF-region metallurgical junction 78. Annular extension region 76 also forms a metallurgical junction with first RESURF region 64. Both annular extension region 76 and second RESURF region 66 form metallurgical junctions with underlying substrate 80.

Various dopant profiles and geometric configurations of LDMOS transistor 10 may contribute to one or more advantages of such a device. Specifically, a breakdown voltage of LDMOS transistor 10 can be increased, and/or an on-resistance of LDMOS transistor 10 can be reduced. First RESURF region 64 can be biased so as to substantially deplete carriers from drift region 52 immediately above first RESURF region 64. At high drain voltages, however, a voltage differential between drift region 52 and first RESURF region 64 near drain contact region 50 need not be as large as a voltage differential applied between drain contact region 60 and body contact region 42. Second RESURF region 66 can be used to control a free carrier population in first RESURF region 64. By controlling the free carrier population in first RESURF region 64, the voltage profile can be longitudinally controlled within drift region 52.

Two geometric relationships facilitate a tolerance of high voltages in LDMOS transistor 10: i) first RESURF region 64 does not longitudinally extend to a location directly beneath drain contact region 60; and ii) second RESURF region 66 does not longitudinally extend to a location directly beneath source 18. Because of these two geometric relationships, a separation distance between drain contact region 60 and first RESURF region 64 is greater than a vertical separation distance between these same regions, and a separation distance between source 18 and second RESURF region 66 is greater than a vertical separation distance between these same regions.

The above is simply a statement that the diagonal distances are greater than the vertical component of these diagonal distances, respectively. If first and second RESURF regions 64, 66 extended to locations beneath drain contact region 52 and source 18, respectively, then these separation distances would be reduced to the vertical separation distances. Thus, the voltage differences between these separated regions can be distributed so as to reduce the corresponding electric field strengths. Thus, the first and second RESURF regions 64, 66 have a longitudinal extent that permits control of a free carrier population in drift region 52, but not an extent that compromises a breakdown voltage.

Figure 2:
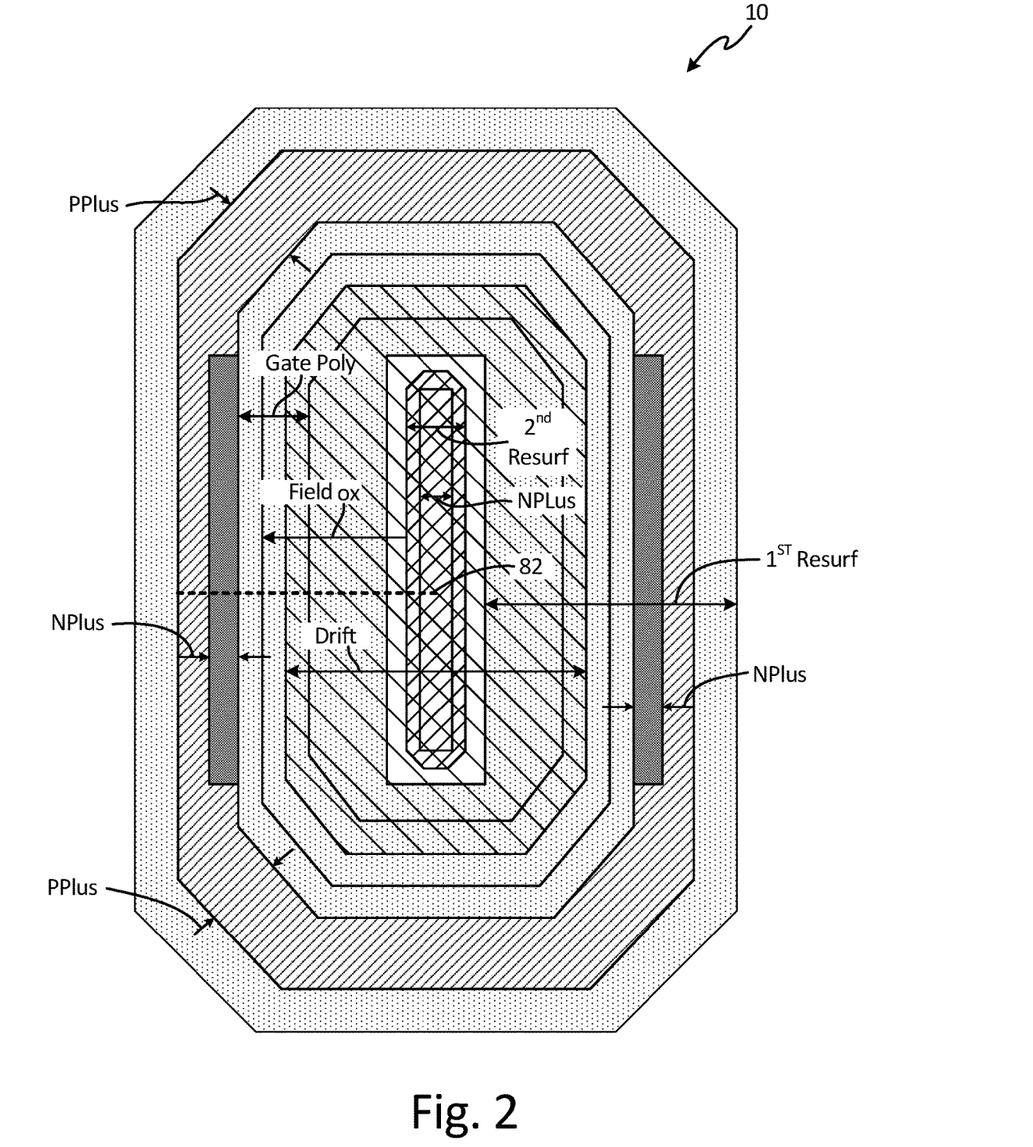
FIG. 2 is a plan view of an exemplary LDMOS transistor with lightly-doped annular RESURF periphery.

FIG. 2 is a plan view of an exemplary LDMOS transistor with lightly-doped annular RESURF periphery. The line at which cross-sectional view of FIG. 1 is taken is identified as dashed line 82 in FIG. 2. In FIG. 2, a subset of layers used in forming LDMOS transistor 10 are depicted. Layout features will be described roughly from center line 84 to an outer edge of LDMOS transistor 10. Drain contact region 60 is formed in a central location of LDMOS 10. Drain contact region 60 provides conductive connection between interconnect net 34 and second drift region 56 (depicted in FIG. 1). Drain contact region also provides conductive connection between interconnect net 34 and second RESURF region 66. Second RESURF region 66 can experience a large thermal budget so as to longitudinally grow much larger than is depicted in FIG. 2. Outside of second RESURF region 66 is the annular RESURF periphery identified in FIG. 1 as annular extension region 76.

Drain contact region 60 can be masked during a field oxidation step so that field dielectric 30 surrounds drain contact region 60. Field dielectric 30 forms an annular ring extending from drain contact region 60, beyond second drift region 56, and to beneath polysilicon gate 20. Polysilicon gate 20 is an annular feature that circumscribes drain contact region 60. Polysilicon gate 20 extends from above field dielectric 30 to end 40 of polysilicon gate 20. End 40 of polysilicon gate can be used to mask implantations of both source 18 and active body region 46 (depicted in FIG. 1). Source 18 is an annular feature that circumscribes polysilicon gate 20 and abuts end 40 of polysilicon 20. Active body region 46 is also an annular feature that circumscribes polysilicon gate 20. Both source 18 and body then diffuse a controlled distance underneath polysilicon gate 20.

Body contact region 42 is an annular feature that circumscribes and abuts source 18. Body contact region 42 provides conductive connection to both active body region 46 and first RESURF region 64. First RESURF region 64 extends from body contact region 42 toward drain contact region 60, forming an annular ring circumscribing drain contact region 60. First RESURF region 64 extends toward drain contact as a single-tooth comb structure. First RESURF region is vertically sandwiched between second drift region 56 and second RESURF region 66, which form a complementary two-tooth comb structure. The three teeth (i.e., second drift region 56, first RESURF region 64, and second RESURF region 66) are oriented in alternating direction. The single tooth formed by first RESURF region 64 projecting toward drain contact region 60, and the two teeth formed by second drift region 56 and second RESURF region 66 projecting away from drain contact region 60.

Figure 3:
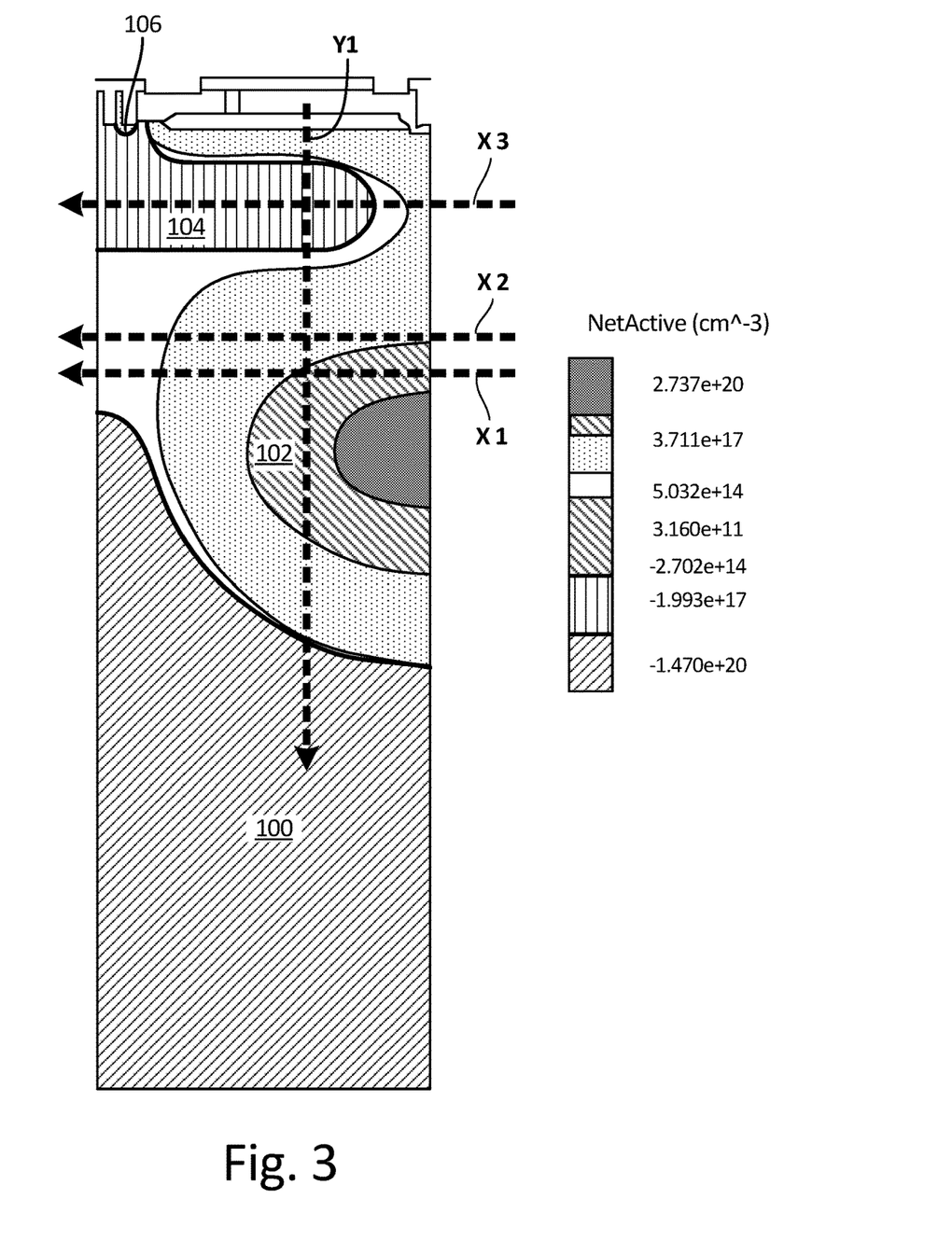
FIG. 3 is a cross-sectional view of an exemplary double-RESURF LDMOS transistor showing net dopant concentrations.

FIG. 3 is a cross-sectional view of an exemplary double-RESURF LDMOS transistor showing net dopant concentrations. In FIG. 3, LDMOS transistor 10 has four mutually exclusive contiguous dopant regions 100, 102, 104, 106. In the depicted cross-section, first dopant region 100 is a p-type region that includes most of substrate 80. Second dopant region 102 is an n-type region that includes drain contact region 50, drift region 52, vertical conduction region 68, second RESURF region 66, and annular extension region 76. Third dopant region 104 is a p-type region that includes body contact region 42, body sinker region 44, and active body region 46. Fourth dopant region 106 is an n-type region that includes source 18. LDMOS transistor 10 is thus an NMOS type device as indicated by the depicted dopant types. Four dashed lines X1, X2, X3, Y1 indicate directions along which cross-sectional dopant concentration profiles will be depicted in FIGS. 4A-4D. FIG. 3 illustrates the interdigitated fingers of drift region 52, first RESURF region 64 and second RESURF region 66.

Figure 4A:
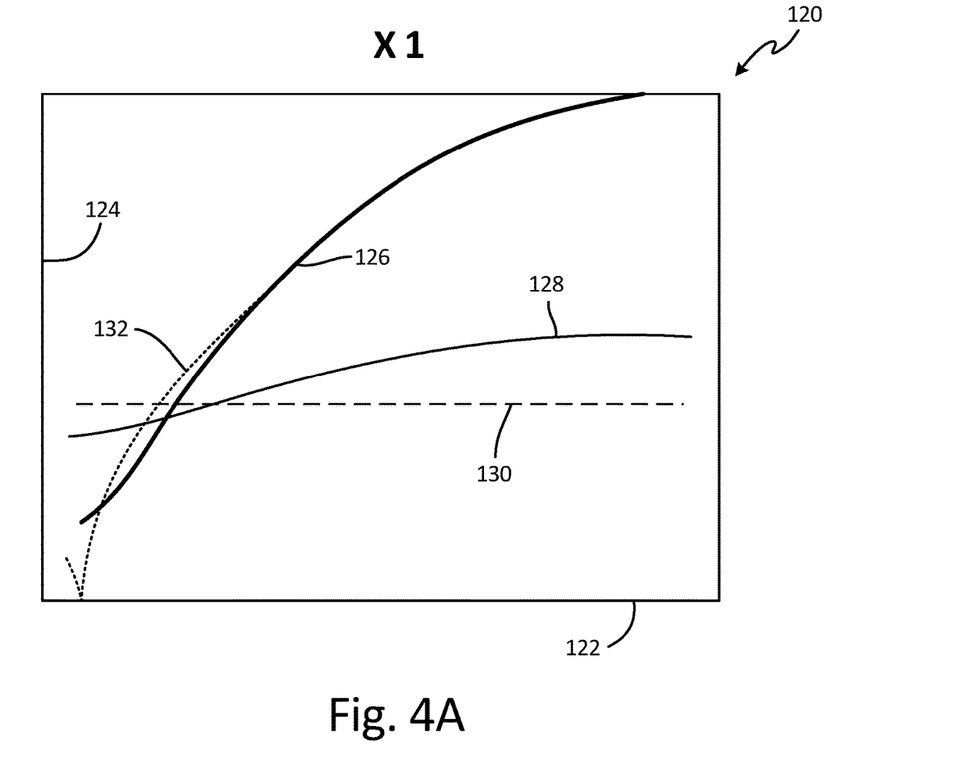
FIGS. 4A-4D are graphs showing dopant profiles along various dimensions of an exemplary double-RESURF LDMOS transistor.

FIGS. 4A-4D are graphs showing dopant profiles along various dimensions of an exemplary double-RESURF LDMOS transistor. In FIG. 4A, graph 120 shows dopant concentrations along dashed line X1 of FIG. 1. Dashed line X1 corresponds to a horizontal cross-section through second RESURF region 66 and annular extension region 76. Graph 120 includes horizontal axis 122, which corresponds to a depth dimension along dashed line X1. Graph 120 includes vertical axis 124 which corresponds to a concentration of dopant atoms. Graph 120 includes four dopant profiles 126, 128, 130, 132.

Dopant profile 126 depicts a concentration of antimony (Sb). Dopant profile 128 depicts a concentration of phosphorus (P). Second RESURF region 66 is formed by the antimony and the phosphorus dopant species. Dopant profile 130 depicts a concentration of arsenic (As), which corresponds to annular extension region 76. Annular extension region 76 may have a net dopant concentration of an epitaxial layer. Dopant profile 132 depicts a net active dopant concentration. End 74 of second RESURF region 66 can be defined in various manners. End 74 can be the location at which net dopant concentration is equal to about 2 times, 3 times, 5 times, or about 10 times a net dopant concentration of an epitaxial region, for example.

Figure 4B:
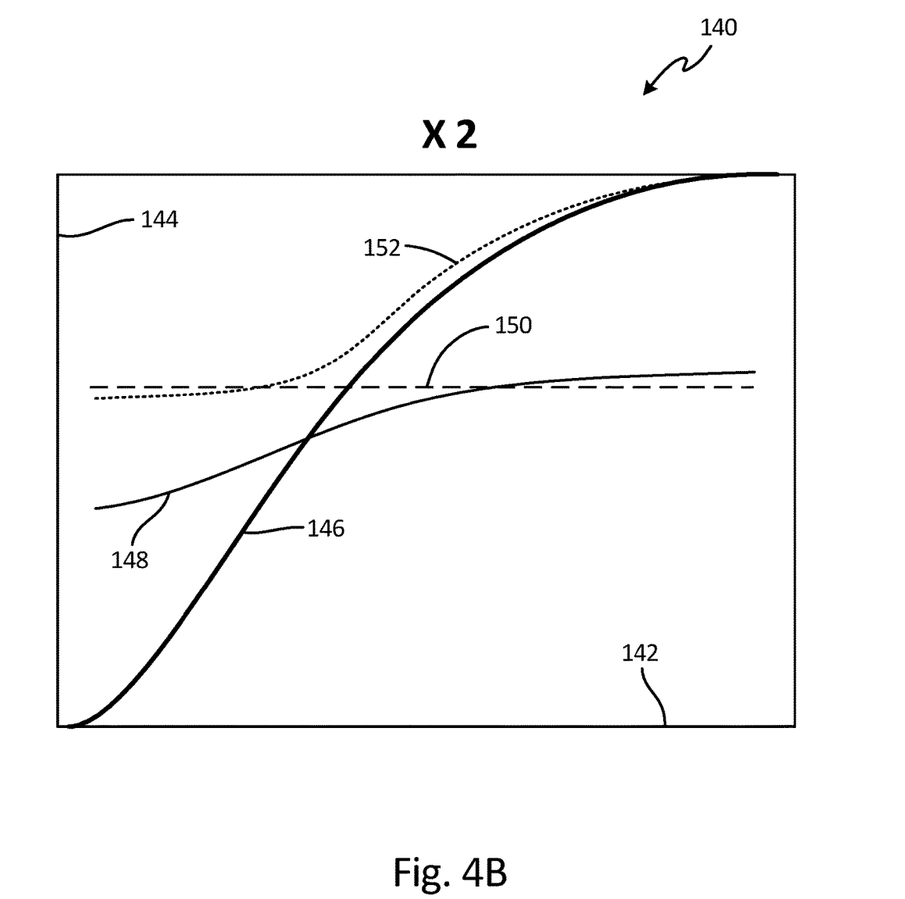

In FIG. 4B, graph 140 shows dopant concentrations along dashed line X2 of FIG. 1. Dashed line X2 corresponds to a horizontal cross-section through second RESURF region 66 and annular extension region 76, but at a different vertical location than dashed line X1. Graph 140 includes horizontal axis 142, which corresponds to a depth dimension along dashed line X2. Graph 140 includes vertical axis 144 which corresponds to a concentration of dopant atoms. Graph 140 includes four dopant profiles 146, 148, 150, 152.

Dopant profile 146 depicts a concentration of antimony (Sb). Dopant profile 148 depicts a concentration of phosphorus (P). Second RESURF region 66 is formed by the antimony and the phosphorus dopant species. Dopant profile 150 depicts a concentration of arsenic (As), which corresponds to annular extension region 76. Annular extension region 76 may have a net dopant concentration of an epitaxial layer. Dopant profile 152 depicts a net active dopant concentration. In some embodiments, end 74 can be the location at which net dopant concentration is equal to about 2 times, 3 times, 5 times, or about 10 times a net dopant concentration of substrate 80.

Figure 4C:
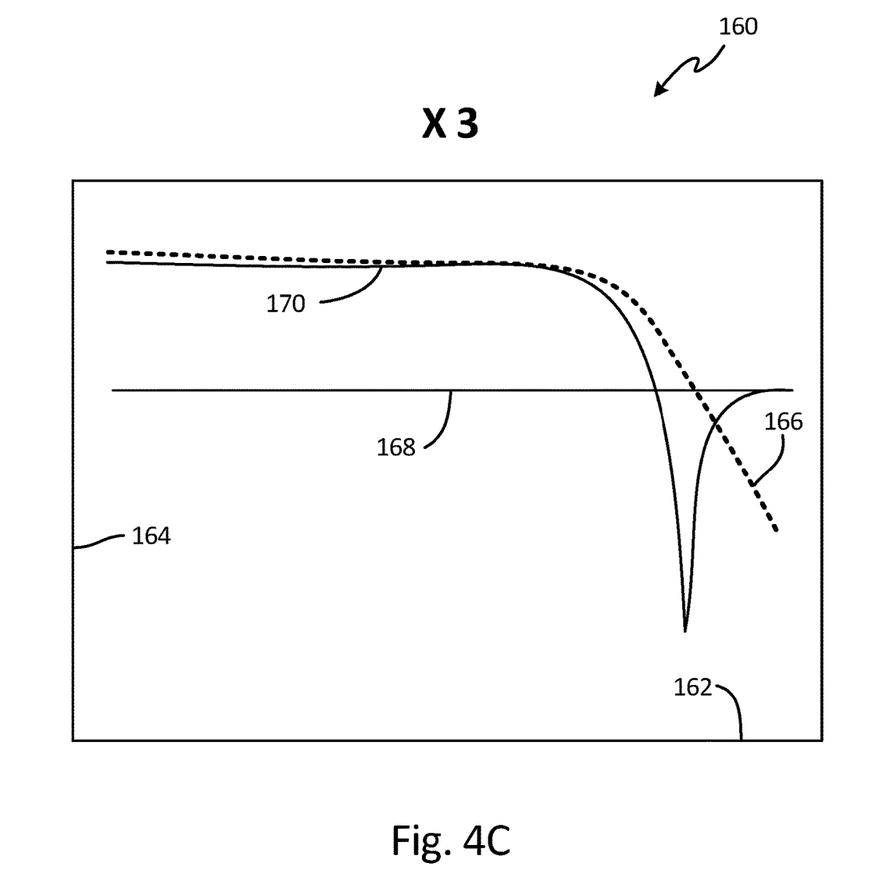

In FIG. 4C, graph 160 shows dopant concentrations along dashed line X3 of FIG. 1. Dashed line X3 corresponds to a horizontal cross-section from vertical conduction region 68 to first RESURF region 64. Graph 160 includes horizontal axis 162, which corresponds to a depth dimension along dashed line X3. Graph 160 includes vertical axis 164 which corresponds to a concentration of dopant atoms. Graph 160 includes three dopant profiles 166, 168, 170.

Dopant profile 166 depicts a concentration of boron (B), which corresponds to First RESURF region 64. Dopant profile 168 depicts a concentration of arsenic (As), which corresponds to vertical conduction region 68. Dopant profile 170 depicts a net active dopant concentration. First-RESURF-region/vertical-conductive-region metallurgical junction 70 is defined at the location where net dopant concentration is zero, which is approximately at a location at which the boron concentration of dopant profile 166 is equal to the arsenic concentration of dopant profile 168.

Figure 4D:
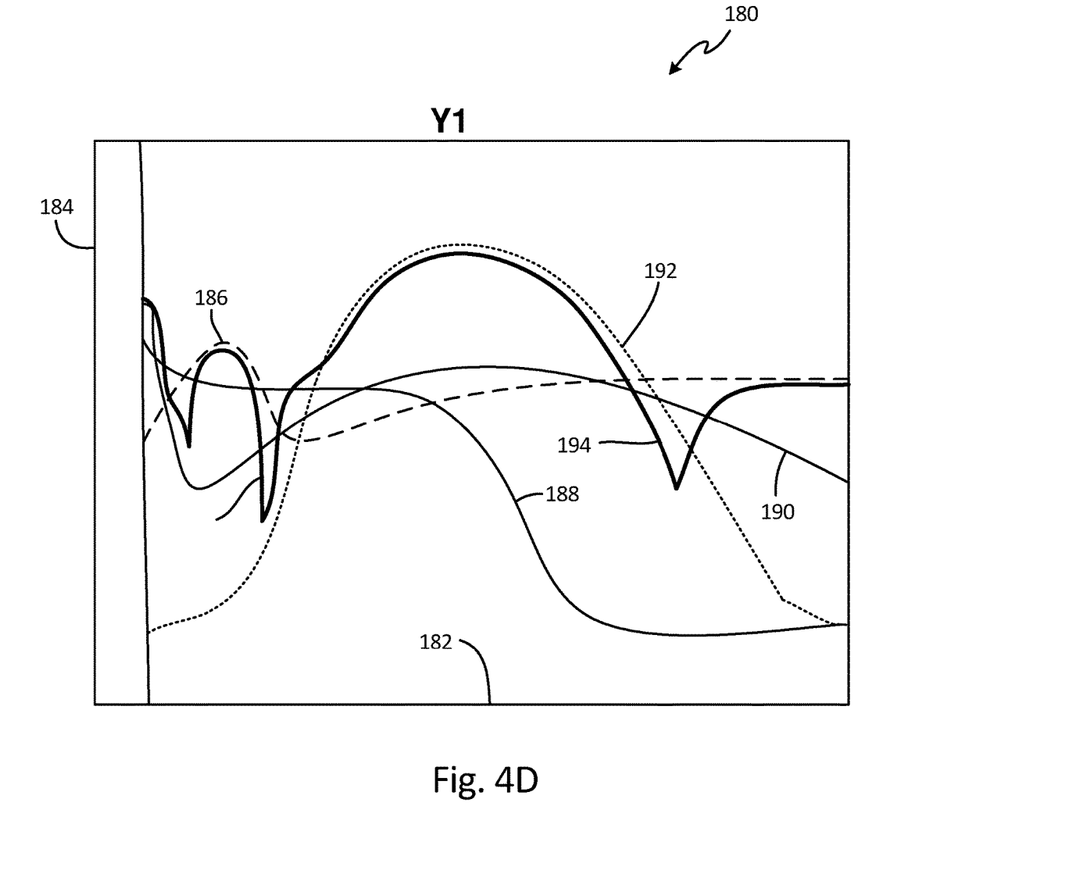

In FIG. 4D, graph 180 shows dopant concentrations along dashed line Y1 of FIG. 1. Dashed line Y1 corresponds to a vertical cross-section from drift region 52, through first RESURF region 64 and second RESURF region 66, and to substrate 80. Graph 180 includes horizontal axis 182, which corresponds to a depth dimension along dashed line Y1. Graph 180 includes vertical axis 184 which corresponds to a concentration of dopant atoms. Graph 180 includes five dopant profiles 186, 188, 190, 192, 194.

Dopant profile 186 depicts a concentration of boron (B), which corresponds to First RESURF region 64 and substrate 80. Dopant profile 188 depicts a concentration of arsenic (As), which corresponds to an epitaxial layer. Dopant profile 190 depicts a concentration of phosphorus (P), which corresponds to second drift region 56 and second RESURF region 66. Dopant profile 192 depicts a concentration of antimony (Sb), which corresponds to second RESURF region 66. Dopant profile 194 depicts a net active dopant concentration. Three metallurgical junctions 72, 78, 82 can be seen in this vertical cross-section.

First-RESURF-region/drift-region metallurgical junction 72 is approximately at a location at which the phosphorus concentration of second drift region 56 is equal to the boron concentration of first RESURF region 64. Second-RESURF-region/first-RESURF-region metallurgical junction 78 is approximately at a location at which the boron concentration of first RESURF region 64 is equal to a sum of the antimony and phosphorus concentrations of second RESURF region 66. Substrate/second-RESURF-region metallurgical junction 82 is approximately at a location at which the sum of sum of the antimony and phosphorus concentrations of second RESURF region 66 is equal to the boron concentration of substrate 80.

Figure 5:
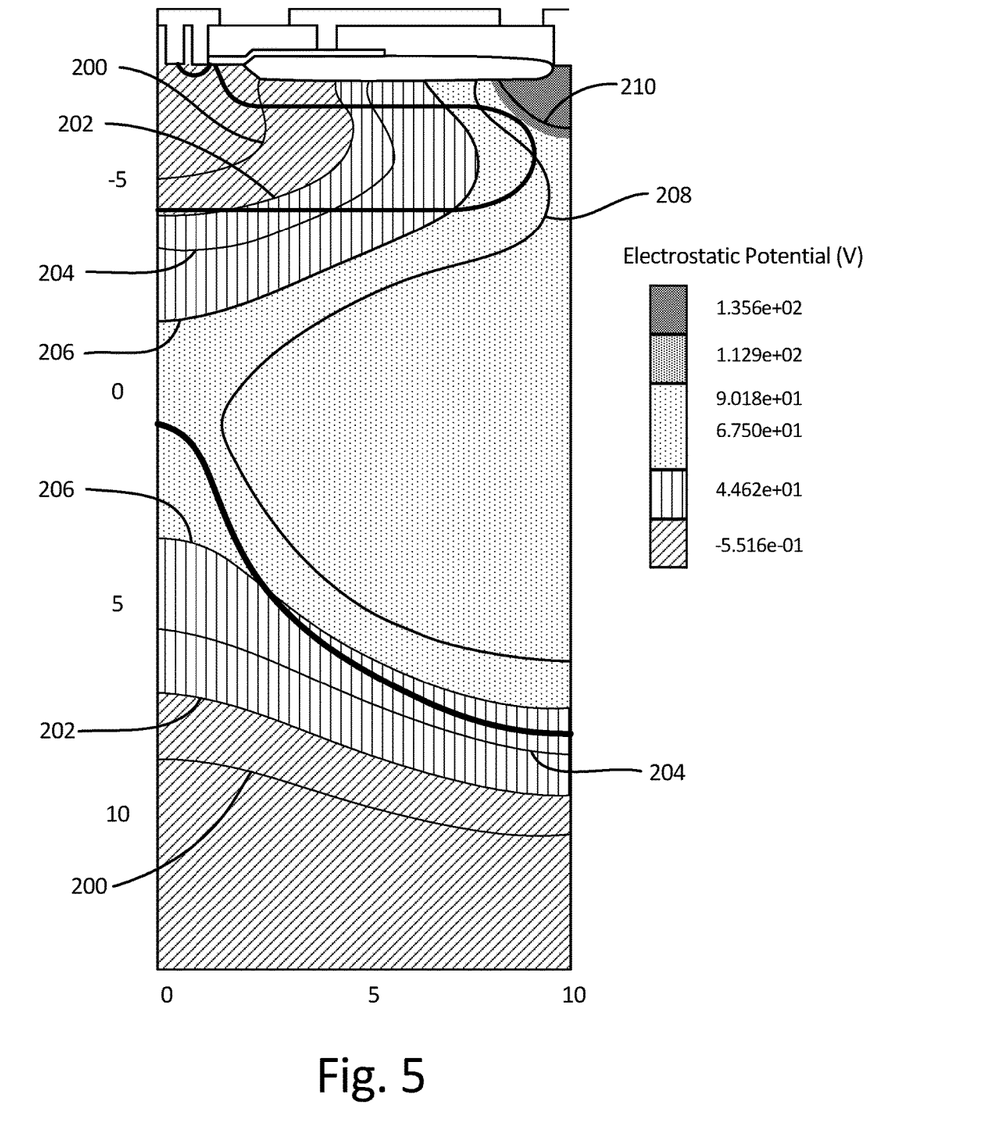
FIG. 5 is a cross-sectional view of an exemplary double-RESURF LDMOS transistor showing voltage distribution under a predetermined bias condition.

FIG. 5 is a cross-sectional view of an exemplary double-RESURF LDMOS transistor showing voltage distribution under a predetermined bias condition. In FIG. 5, cross section of LDMOS transistor 10 is annotated with lines of constant voltage 200, 202, 204, 206, 208, 210, 212, 214, 216, 218. A bias of 138 Volts is applied to drain 22, while 0 volts is applied to source 18, gate 20 and body 24. Metallurgical junctions 72, 78, 82 are highlighted as reference lines identifying the junctions separating each of first, second, third, and fourth dopant regions 100, 102, 104, 106 as identified in FIG. 3 above.

Under this bias condition, lines of constant voltage 200, 202, 204, 206, 208, 210, 212, 214, 216, 218 are substantially evenly longitudinally distributed between active body region 42 and drain contact region 60. Constant voltage lines 200, 202, 204, 206, 208, and 210 correspond to voltages of 0, 27.6, 55.2, 82.8, 110.4, and 138.0, respectively. Such even distribution of voltage can minimize a maximum electric field corresponding to the voltage bias.

Figure 6:
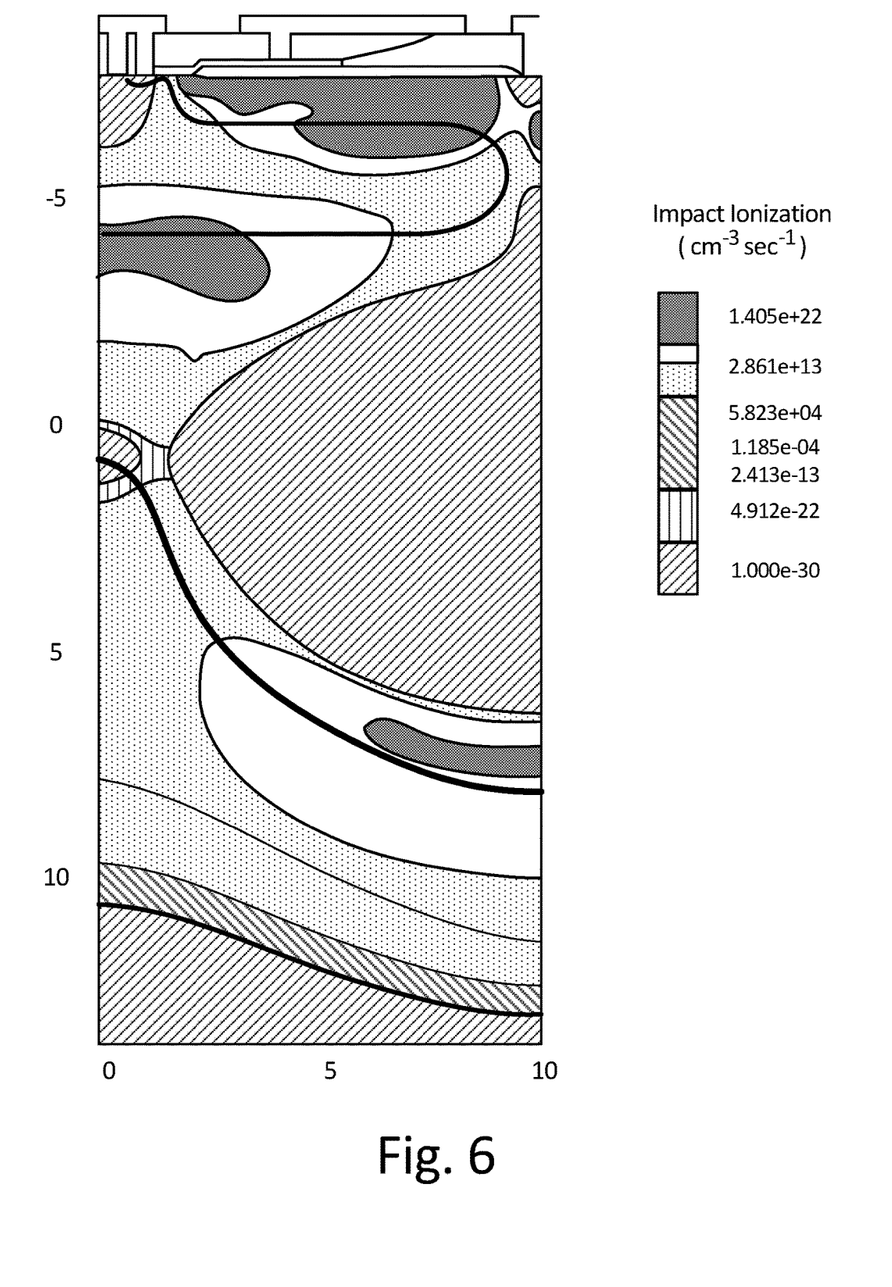
FIG. 6 is a cross-sectional view of an exemplary double-RESURF LDMOS transistor showing impact ionization levels under a predetermined bias condition.

FIG. 6 is a cross-sectional view of an exemplary double-RESURF LDMOS transistor showing impact ionization levels under a predetermined bias condition. In FIG. 6, cross section of LDMOS transistor 10 is annotated with lines of impact ionization 300, 302, 304, 306, 308, 310, 312, 314, 316, 318. Impact ionization roughly to regions in FIG. 5 where adjacent lines of constant voltage are close to one another.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An electronic device comprising:
a Laterally-Diffused Metal-Oxide-Semiconductor (LDMOS) transistor formed in a semiconductor die having an interconnect region on an active region,
wherein the interconnect region comprises:
a gate of the LDMOS transistor, the gate isolated from the active region via a dielectric,
wherein the active region comprises:
a source of the LDMOS transistor longitudinally aligned to an end of the gate, the source having a first conductivity type;
a drain of the LDMOS transistor, the drain comprising:
a drain contact region having the first conductivity type; and
a drift region vertically isolated from the gate via the dielectric, the drift region having the first conductivity type;
a body of the LDMOS transistor, the body comprising:
a body contact region having a second conductivity type; and
a channel region juxtaposed longitudinally between the source and the drift region, the channel region vertically isolated from the gate via the dielectric, the channel region having the second conductivity type;
a lower RESURF region substantially parallel to and vertically separated from the drift region, the lower RESURF region having the first conductivity type;
an extension region extending from an end of the lower RESURF region and under the body contact region, the extension region having the first conductivity type, the extension region having a net dopant concentration less than a net dopant concentration of the lower RESURF region; and
an upper RESURF region adjacent to and vertically interdigitated between both the drift region above and the lower RESURF region below, the upper RESURF region having the second conductivity type,
wherein a first longitudinal distance between the drain contact region and the body contact region is greater than a second longitudinal distance between the drain contact region and the end of the lower RESURF region.

2. The LDMOS transistor of claim 1, wherein the active region comprises an epitaxial layer grown on a substrate.

3. The LDMOS transistor of claim 2, wherein the end of the lower RESURF region is defined as the longitudinal location where a net dopant concentration of the lower RESURF region is at a predetermined threshold.

4. The LDMOS transistor of claim 3, wherein the predetermined threshold is defined as ten times a net dopant concentration of the epitaxial layer.

5. The LDMOS transistor of claim 3, wherein the predetermined threshold is defined as ten times a net dopant concentration of the substrate.

6. The LDMOS transistor of claim 2, wherein the substrate has the second conductivity type and the epitaxial layer has the first conductivity type.

7. The LDMOS transistor of claim 1, wherein the upper RESURF region is conductively coupled to the body.

8. The LDMOS transistor of claim 1, wherein the lower RESURF region is conductively coupled to the drain via a vertical conduction path.

9. The LDMOS transistor of claim 8, wherein the vertical conduction path has a net dopant concentration that is less than both the net dopant concentrations of the lower RESURF region and the drift region.

10. The LDMOS transistor of claim 1, wherein the extension region has a net dopant concentration that is substantially equal to a net dopant concentration of an epitaxial layer.

11. A method of manufacturing the LDMOS transistor of claim 1, the method comprising:
    providing a substrate of a first type of dopant species;
    implanting the lower RESURF region into the substrate using a dopant species of a second type;
    growing an epitaxial layer of the second type of dopant species; and
    implanting the upper RESURF region into the epitaxial layer using a dopant species of the first type.

12. The method of claim 11, wherein implanting the upper RESURF region uses an implant energy greater than 500,000 volts.

13. The method of claim 11, wherein implanting the upper RESURF region uses an implant energy greater than 1,000,000 volts.

14. An LDMOS transistor comprising the following vertical sequence of layers, in a top to bottom order:
    i) a gate;
    ii) a source;
    iii) a body having a body contact region and an active body region;
    iv) a drain having a drain contact region and a drift region;
    v) a first RESURF region conductively connected to a body of the LDMOS transistor at a source end of the LDMOS transistor; and
    vi) a second RESURF region vertically and conductively connected to a drain contact region at a drain end of the LDMOS transistor via a vertical conduction region,
    wherein the first RESURF region is formed as an annulus surrounding a drain contact region,
    wherein the drift region and the second RESURF region are both closed form geometries extending outward from the drain contact region and forming an annular metallurgical junction with an inner annular portion of the first RESURF region, and
    wherein the body contact region forms an annulus that circumscribes the annular metallurgical junction leaving an annular gap therebetween.

15. The LDMOS transistor of claim 14, wherein a first longitudinal distance between the body contact region and the drain contact region is greater than a second longitudinal distance between the second RESURF region and the drain contact region.

16. The LDMOS transistor of claim 14, wherein a distance between the body contact region and the second RESURF region is greater than a vertical distance between the body contact region and the second RESURF region.

17. A method of manufacturing an LDMOS transistor, the method comprising:
    providing a substrate of a first type of dopant species;
    implanting a lower RESURF layer into the substrate using a dopant species of a second type, the lower RESURF layer having a closed form geometry;
    growing an epitaxial layer of the second type of dopant species, thereby creating an extension region adjacent to the lower RESURF layer;
    implanting an annular upper RESURF layer into the epitaxial layer using a dopant species of the first type, the annular upper RESURF layer surrounding the lower RESURF layer, the upper and lower RESURF layers forming an annular metallurgical junction after lateral process diffusion;
    implanting a drift region into the epitaxial layer using a dopant species of the second type, the drift region having a closed form geometry, the drift region and upper RESURF layer forming an annular metallurgical junction after lateral process diffusion;
    implanting a source contact region and a drain contact region into the epitaxial layer using a dopant species of the second type, wherein the source region is wholly within the extension region, and wherein the drain contact region is surrounded by the annular upper RESURF layer and is wholly within the closed form geometries of the lower RESURF layer and the drift region; and
    implanting a body region into the epitaxial layer using a dopant species of the first type,
    wherein the lower RESURF layer is conductively connected to the drift region via a vertical conduction region of the epitaxial layer, the vertical conduction region masked so as not to be implanted with the upper RESURF layer, thereby maintaining a net dopant concentration of the second type.

18. The method of claim 17, wherein implanting the upper RESURF layer comprises using an implant energy greater than 1,000,000 volts.

* * * * *